United States Patent [19]
Doi et al.

[11] Patent Number: 5,528,171
[45] Date of Patent: Jun. 18, 1996

[54] ECL-TO-CMOS SIGNAL LEVEL CONVERTER

[75] Inventors: Takehito Doi; Susumu Kato; Kiyoshi Matsuo; Tsuyoshi Moribe, all of Kasugai, Japan

[73] Assignees: Fujitsu Limited, Kawasaki; Fujitsu VLSI Limited, Kasugai, both of Japan

[21] Appl. No.: 307,466

[22] Filed: Sep. 19, 1994

[30] Foreign Application Priority Data

Sep. 20, 1993 [JP] Japan ................................ 5-233945

[51] Int. Cl.⁶ ...................... H03K 19/0175; H03K 19/08
[52] U.S. Cl. ............................... 326/66; 326/33; 326/84
[58] Field of Search ........................... 326/66–67, 73, 326/77, 64, 31, 33, 115, 126, 21, 83–84

[56] References Cited

U.S. PATENT DOCUMENTS

| | | | |
|---|---|---|---|
| 5,148,061 | 9/1992 | Hsueh et al. | 326/66 |
| 5,149,992 | 9/1992 | Allstot et al. | 326/115 |
| 5,153,465 | 10/1992 | Sandhu | 326/73 |
| 5,204,557 | 4/1993 | Nguyen | 326/83 |
| 5,225,717 | 7/1993 | Shiomi et al. | 326/66 |
| 5,317,214 | 5/1994 | Lewis | 326/73 |

*Primary Examiner*—Edward P. Westin
*Assistant Examiner*—Jon Santamauro
*Attorney, Agent, or Firm*—Armstrong, Westerman, Hattori, McLeland & Naughton

[57] ABSTRACT

A signal level converter is disclosed, for converting a signal having a first logic voltage swing characteristic to a signal having a second voltage swing characteristic. The converter comprises a level converting section and a differential circuit coupled thereto. The level converting section converts the supplied signal at the first logic voltage swing to an intermediate signal at a logic voltage swing different from the first voltage swing. The differential circuit 3, being supplied with the intermediate signal, produces an output signal at the second voltage swing level that corresponds to the potential difference between a high and low potential power supplies.

6 Claims, 6 Drawing Sheets

ECL-TO-CMOS SIGNAL LEVEL CONVERTER

BACKGROUND OF THE INVENTION

1. Field of the Invention

The present invention generally relates to a logic signal level converter, and in particular, to an apparatus which converts signals having a logic voltage swing characteristic of ECL (Emitter Coupled Logic) into signals having a logic voltage swing characteristic of MOS level signals used in a MOS circuit.

2. Description of the Related Art

The recent progress in the Bi-CMOS technology permits an ECL circuit comprising bipolar transistors and an MOS circuit comprising MOS transistors to be formed together in the same chip. Normally, the amplitude of the input/output signal of the MOS circuit corresponds to the potential difference between a high and low potential power supplies. The amplitude of the input/output signal of the ECL circuit, however, does not comply with the potential difference between the high and low potential power supplies, but generally corresponds to voltage amplitude smaller than the potential difference. The logic voltage swing of an ECL level signal, therefore, is relatively smaller than that of the MOS level signal. Consequently, a signal level converter or a level converting circuit is required to transfer logic signals between the ECL circuit and MOS circuit.

Figure 1:
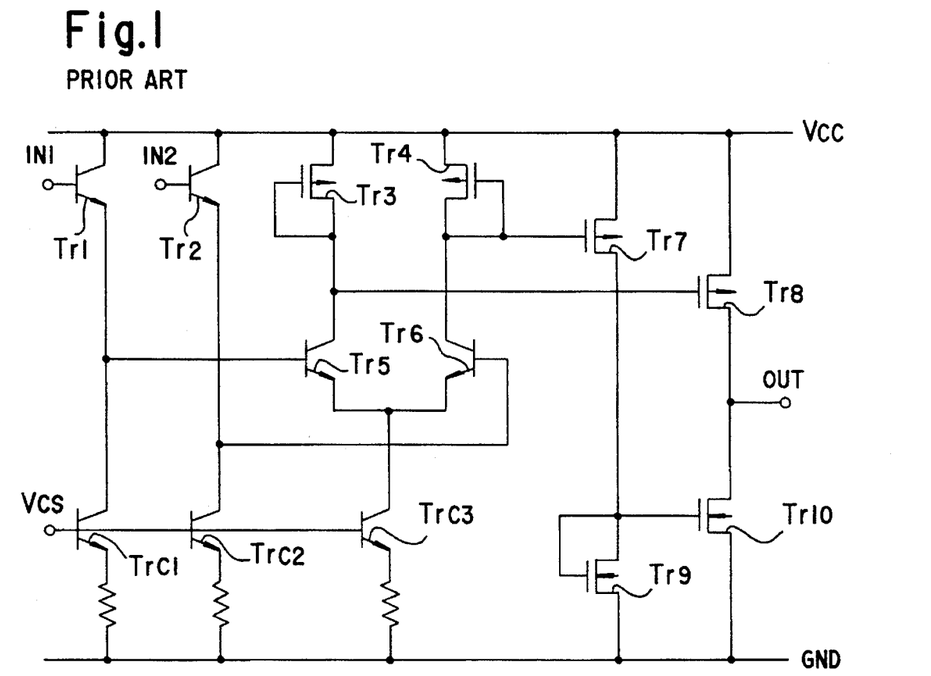
FIG. 1 is a circuit diagram showing a conventional level converting circuit.

FIG. 1 shows one type of conventional level converting circuit. NPN transistors Trc1, Trc2 and Trc3 are turned on in response to an enable signal $V_{CS}$. When complementary input signals IN1 and IN2 of ECL level are input to the circuit, the collector currents flow through NPN transistors Tr1 and Tr2. The difference between the collector currents flowing in Tr1 and Tr2 is based on the potential difference between the input signals IN1 and IN2. This difference in collector current produces a potential difference between the emitters of the transistors Tr1 and Tr2, and a difference between the amounts of the collector currents of NPN transistors Tr5 and Tr6. The latter difference in collector current, in turn, results in a difference in collector potential between the transistors Tr5 and Tr6.

P channel MOS transistors Tr3 and Tr4 are respectively turned on in response to the ON actions of the associated transistors Tr5 and Tr6, supplying the collector currents to those transistors T5 and Tr6. When the transistors Tr5 and Tr6 are turned on, P channel MOS transistors Tr7 and Tr8 are turned on based on the collector potentials of the transistors Tr5 and Tr6. The difference between the drain currents of the transistors Tr7 and Tr8 is determined by the collector potentials of the transistors Tr5 and Tr6.

In response to the turning on of the transistor Tr7, N channel MOS transistors Tr9 and Tr10 turn on. For example, when the gate potential of the transistor Tr7 rises high and the gate potential of the transistor Tr8 goes low, the gate potential of the transistor Tr10 drops low. Consequently, the transistor Tr8 turns on and the transistor Tr10 nearly turns off. Consequently, the output signal OUT goes high. On the other hand, when the gate potential of the transistor Tr7 falls low and the gate potential of the transistor Tr8 rises high, the gate potential of the transistor Tr10 goes high. As a result, the transistor Tr8 nearly turns off and the transistor Tr10 turns on, setting the output signal OUT low. In this manner, the complements of ECL level signals IN1 and IN2 are converted into a signal having a logic level swing similar to the MOS level output signal OUT.

In this level converting circuit, when a high output signal OUT is produced, the transistor Tr10 does not completely turn off. When the L-level output signal OUT is produced, likewise, the transistor Tr8 does not completely turn off. As a consequence, the amplitude of the output signal OUT does not completely match with the potential difference between the power supply $V_{CC}$ and ground GND.

Generally speaking, the threshold value of signals used in MOS circuits is determined by the characteristic ratio of the PMOS transistor to the NMOS transistor, both of which are connected in series between the high potential power supply $V_{CC}$ and the ground GND as the low potential power supply. In many cases, the threshold value is set to around the intermediate potential between the power supply $V_{CC}$ and the ground GND. In these MOS circuits, when the voltage of the power supply $V_{CC}$ rises, the threshold value also increases. If the amplitude of the output signal OUT from the level converting circuit is too small when the threshold value of the MOS circuit, coupled to the subsequent stage of the level converting circuit increases, the level converting circuit may inaccurately transmit signals reflective of logic to that MOS circuit.

As the operational speed of the level converting circuit increases in accordance with quick switching of the levels of the input signals IN1 and IN2, the amplitude of the output signal OUT tends to decrease. The faster the level switching of the input signals IN1 and IN2 is, therefore, the more difficult it becomes to accurately transmit actual logic levels to the. MOS circuit.

In the conventional level converting circuit, three stages of bipolar transistors such as the transistors Tr1, Tr5 and Trc3, are present between the power supply $V_{CC}$ and ground GND. Accordingly, the potential difference between the power supply $V_{CC}$ and ground GND should be equal to or greater than three times the base-emitter voltage drop $V_{cs}$ of one bioplar transistor. This inhibits the use of any low voltage power supplies as the high potential power supply $V_{CC}$.

SUMMARY OF THE INVENTION

Accordingly, it is a primary objective of the present invention to provide a signal level converter which can transmit accurate levels of logic signals between an ECL circuit and a MOS circuit when the threshold value of the MOS circuit increases or when the ECL circuit executes rapid input signal level shifting.

To achieve the foregoing and other objects and in accordance with the purpose of the present invention, an improved signal level converter is provided for converting a signal supplied thereto at a first logic voltage swing into a signal output therefrom at a second voltage swing.

Figure 2:
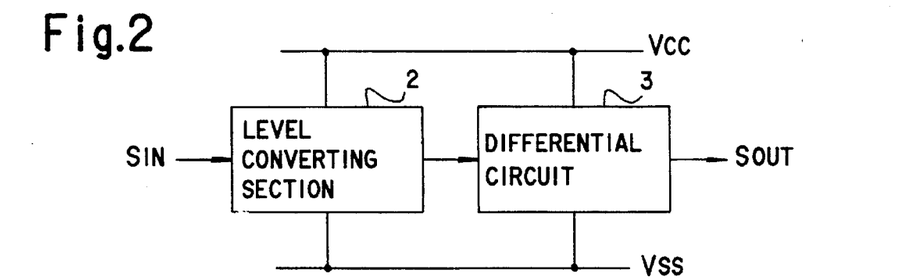
FIG. 2 is a block diagram illustrating essential parts of signal level converter according to the present invention.

The signal level converter according to the present invention is supplied with power from a high and low potential power supplies $V_{CC\ and\ VSS}$, and comprises a level converting section 2 and a differential circuit 3, as shown in FIG. 2. The level converting section 2 converts a supplied signal $S_{IN}$ at the first logic voltage swing into an intermediate signal at a logic voltage swing different from the first voltage swing. The differential circuit 3 is coupled to the level converting section 2. In response to the intermediate signal output from the converting section, the differential circuit 3 generates an output signal $S_{OUT}$ at the second voltage swing such that the amplitude of second voltage swing corresponds to the difference between the high and low potential power supplies.

It is preferable that the first voltage swing corresponds to that of ECL level signal used in an ECL circuit, and that the second voltage swing corresponds to that of MOS level signal used in a MOS circuit.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

DETAILED DESCRIPTION OF THE PREFERRED EMBODIMENT

First Embodiment

Figure 3:
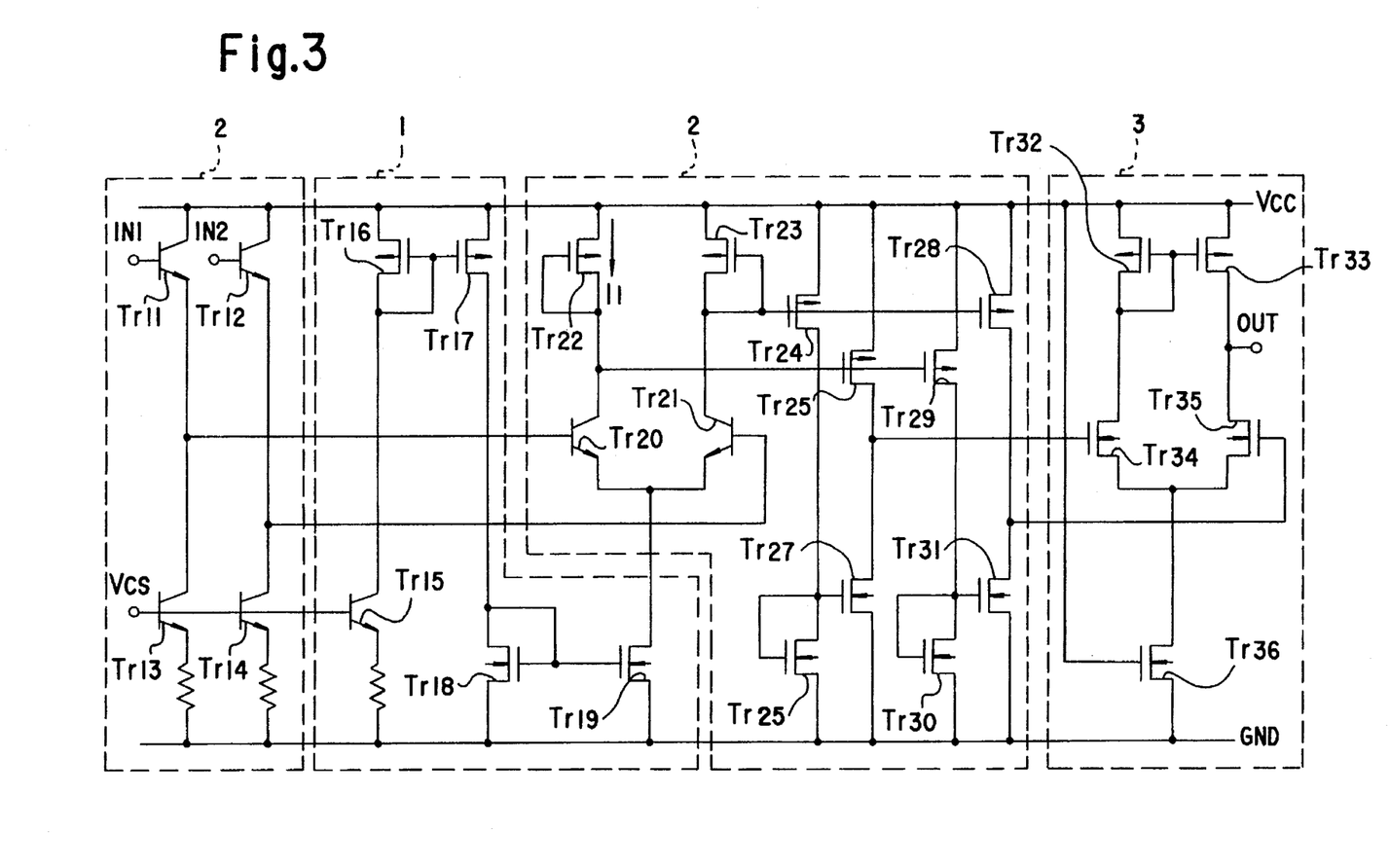
FIG. 3 is a circuit diagram showing a first embodiment of the present invention.

FIG. 3 shows a signal level converter or a level converting circuit according to a first embodiment of the present invention. NPN transistors Tr11 and Tr12 have bases which receive complementary ECL level input signals IN1 and IN2, collectors connected to a high potential power supply $V_{CC}$ and emitters connected to the collectors of NPN transistors Tr13 and Tr14. The NPN transistors Tr13 and Tr14, which form a current source, have bases for receiving an enable signal $V_{CS}$.

An NPN transistor Tr15 as a current source has a base that receives the enable signal $V_{CS}$, and a collector connected to the drain of a P channel MOS transistor Tr16. The transistor Tr16 and an another P channel MOS transistor Tr17 form a current mirror circuit, with the drain of the transistor Tr17 connected to the drain of an N channel MOS transistor Tr18. The transistor Tr18 and an another N channel MOS transistor Tr19 form a current mirror circuit. The drain of the transistor Tr19 is connected to the emitters of NPN transistors Tr20 and Tr21. The transistors Tr15 to Tr19, thus arranged, form a current source circuit 1 for the transistors Tr20 and Tr21.

The base of the transistor Tr20 is connected to the emitter of the transistor Tr11, and the base of the transistor Tr21 is connected to the emitter of the transistor Tr12. A P channel MOS transistor Tr22 serving as a current source is connected to the collector of the transistor Tr20, and a P channel MOS transistor Tr23, also serving as a current source, is connected to the collector of the transistor Tr21. The collector of the transistor Tr20 is further connected to the gates of P channel MOS transistors Tr25 and Tr29, while the collector of the transistor Tr21 is further connected to the gates of P channel MOS transistors Tr24 and Tr28. The sources of the transistors Tr25, Tr29, Tr24 and Tr28 are connected to the power supply $V_{CC}$.

The drain of the transistor Tr24 is connected to the drain and gate of an N channel MOS transistor Tr26 and to the gate of an N channel MOS transistor Tr27, with the source of the transistor Tr26 grounded. The drain of the transistor Tr25 is connected to the drain of the transistor Tr27 whose source is grounded. The drain of the transistor Tr29 is connected to the drain and gate of an N channel MOS transistor Tr30 and to the gate of an N channel MOS transistor Tr31, with the source of the transistor Tr30 grounded. The transistor Tr31 has a drain connected to the drain of the transistor Tr28 and a source connected to the ground GND.

The signal level converter according to this embodiment includes an MOS differential circuit 3 comprising a plurality of MOS transistors Tr32 to Tr36. The drains of the transistors Tr25 and Tr27 are connected to the gate of an N channel MOS transistor Tr34. The drains of the transistors Tr28 and Tr31 are connected to the gate of an N channel MOS transistor Tr35. The sources of the transistors Tr34 and Tr35 are connected together and are also connected to the ground GND via an N channel MOS transistor Tr36. The transistor Tr36 has its gate connected to the power supply $V_{CC}$ and consequently is maintained turned on. Therefore, the transistor Tr36 functions as a current source for the MOS differential circuit 3.

The PMOS transistor Tr32 has a source connected to the power supply $V_{CC}$, a drain connected to the drain of the transistor Tr34, and a gate connected to its own drain. The PMOS transistor Tr33 has a source connected to the power supply $V_{CC}$, a drain connected to the drain of the transistor Tr35 and a gate connected to the gate of the transistor Tr32. The two PMOS transistors Tr32 and Tr33 therefore form a current mirror circuit. The output signal OUT is produced from the common drain of the transistors Tr33 and Tr35.

The signal level converter shown in FIG. 3 comprises the current source circuit 1, the MOS differential circuit 3 and the remaining circuitry 2 that functions as the level converting section.

The operation of the level converter of this embodiment will now be explained. Suppose that the ECL level input signals IN1 and the input signal IN2 are at a high and low level respectively. Due to the base-emitter voltage drops of the transistors Tr11 and Tr12, the input signals IN1 and IN2 are shifted low, and the level-shifted signals are applied to the bases of the transistors Tr20 and Tr21. As a result, the transistor Tr20 turns on and the transistor Tr21 turns off. In response to the turning on of the transistor Tr20, a current I1 flows through the transistors Tr22 and Tr20, turning on the transistors Tr25 and Tr29 due to the current I1. The transistors Tr24 and Tr28 turn off in response to the turning off of the transistor Tr21. As a result, the transistors Tr26 and Tr27 turn off, and the transistors Tr30 and Tr31 turn on.

Consequently, the gate potential of the transistor Tr34 goes high allowing the transistor Tr34 to turn on. At the same time, the gate potential of the transistor Tr35 goes low causing the transistor Tr35 to turn off. The turning on of the transistor Tr34 causes the transistor Tr33 to be turned on, thus setting the output signal OUT high.

When the input signal IN1 is low and the input signal IN2 is high, on the other hand, the above-described transistors behave in just the opposite fashion. Consequently, the gate potential of the transistor Tr34 goes low so that this transistor Tr34 turns off. Concurrent to that, the gate potential of the transistor Tr35 goes high allowing the transistor Tr35 to turn on. The turning off of the transistor Tr34 causes the transistor Tr33 to be turned off. This sets the drain of the transistor Tr35 at the ground level via the transistor Tr36 so that the output signal OUT goes low.

According to this embodiment, the MOS differential circuit 3 is driven to output the signal OUT in response to the output signal of the level converting section 2, which functions in the same manner as the conventional level converting circuit. The threshold value of the MOS differential circuit 3 depends on the threshold values of the NMOS transistors Tr34 and Tr35, which are only peripherally affected by the supply voltage. Even if the amplitude of the output signal of the level converting section 2 at the preceding stage of the MOS differential circuit 3 were not to match the potential difference between the power supply $V_{CC}$ and the ground GND, the MOS differential circuit 3 could output the signal OUT at an amplitude matching that of the potential difference between the power supply $V_{CC}$ and the ground GND due to the intrinsic differential characteristic of this circuit 3. This permits the level converter to transmit an accurate logic level to the circuitry at the next stage (i.e., MOS circuit) even when the voltage of the power supply $V_{CC}$ is pulled up. Moreover, this design permits the rapid operation of the level converter at a time the amplitude of the logic voltage swing of the output signal OUT matches the potential difference between the high and low potential supply voltages.

Furthermore, the current source circuit 1 for the level converting section 2 includes two current mirror circuits formed by the MOS transistors Tr16 to Tr19. Two stages of bipolar transistors (the transistors Tr11 and Tr20 and the transistors Tr12 and Tr21) and one stage of MOS transistor Tr19 are arranged in series between the power supply $V_{CC}$ and the ground GND. In general, a voltage drop in a MOS transistor is significantly smaller than a voltage drop in a bipolar transistor. It is therefore possible to set the emitter potential of the transistors Tr20 and Tr21 lower than the emitter potential of the transistors Tr5 and Tr6 of the conventional art. Accordingly, a power supply with a lower voltage can be selected as the power supply $V_{CC}$.

Second Embodiment

Figure 4:
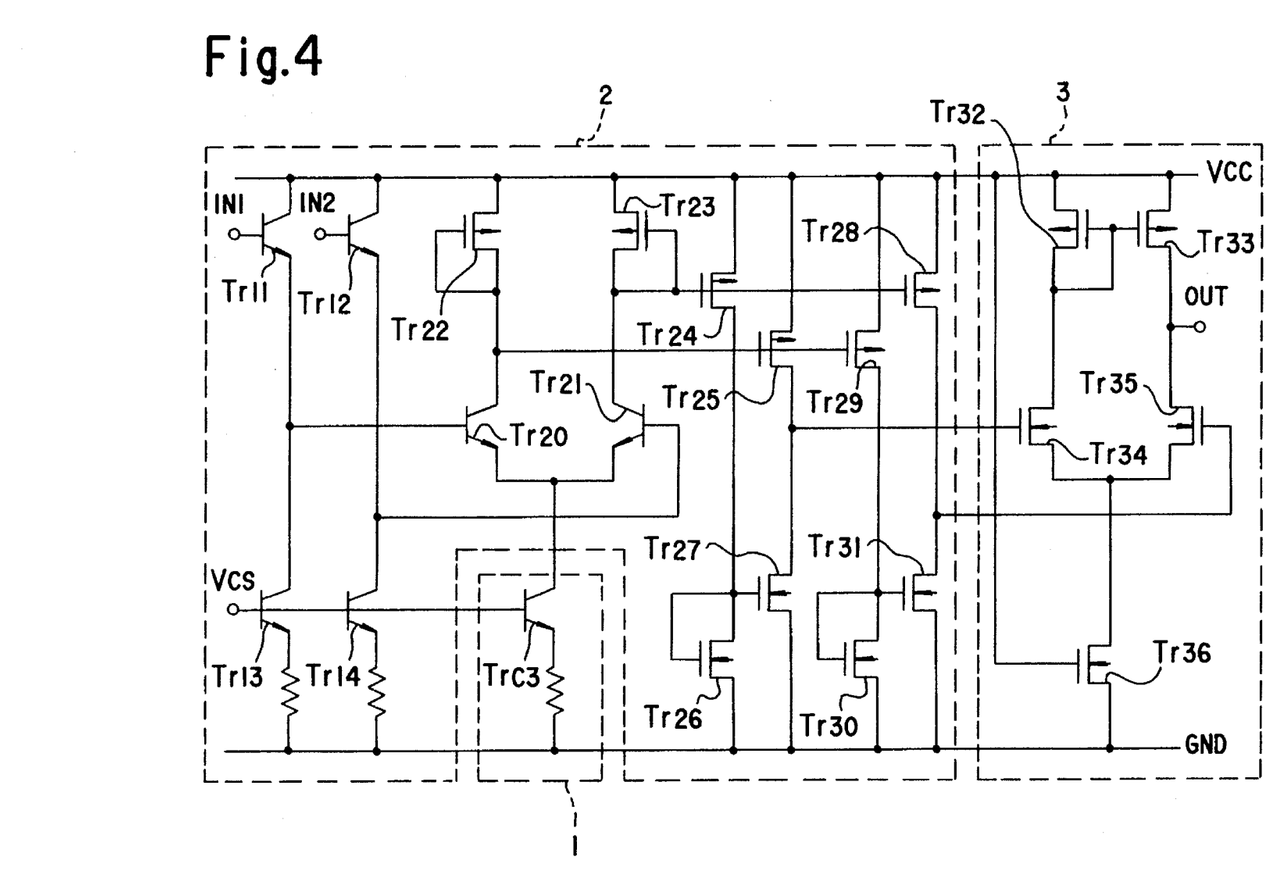
FIG. 4 is a circuit diagram showing a second embodiment of the present invention.

FIG. 4 shows a second embodiment of the present invention. This embodiment differs from the first embodiment in the current source circuit 1 for the transistors Tr20 and Tr21 in the level converting section 2. The current source circuit 1 in the second embodiment includes an NPN transistor Trc3, the base of which receives the enable signal $V_{CS}$ allowing the transistor Trc3 to turn on. The level converter, as per the first embodiment, also produces an output signal OUT whose amplitude corresponds to the potential difference between the power supply $V_{CC}$ and the ground GND, due to the differential characteristic of the MOS differential circuit 3, even when the output signal at the preceding stage has not yet reached its maximum amplitude.

Third Embodiment

Figure 5:
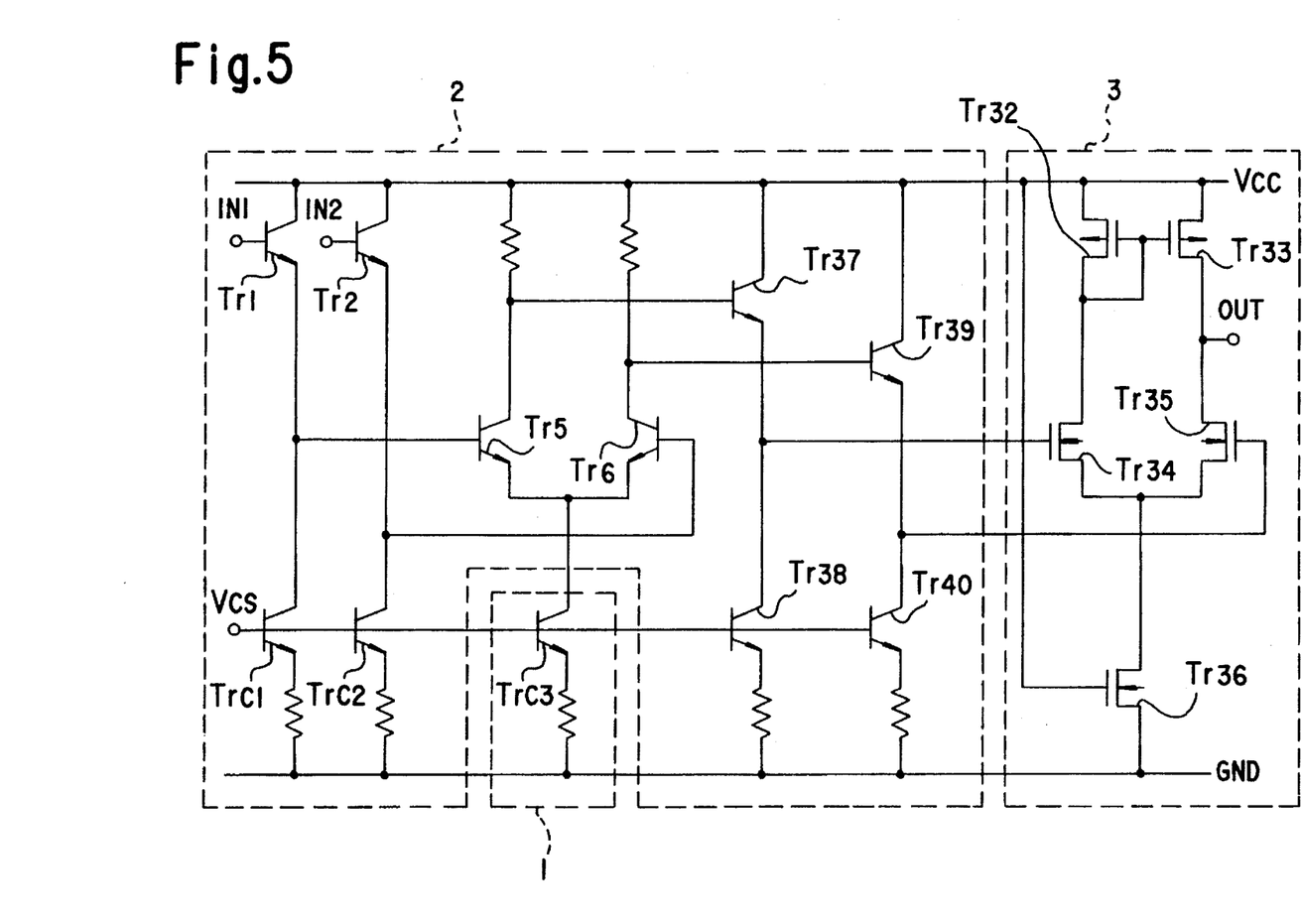
FIG. 5 is a circuit diagram showing a third embodiment of the present invention.

FIG. 5 shows a third embodiment of the present invention. This embodiment has an output stage formed with NPN transistors Tr37 to Tr40 and a MOS differential circuit 3 similar to that of the first embodiment. The converter, like that of the first embodiment, also produces an output signal OUT whose amplitude corresponds to the potential difference between the power supply $V_{CC}$ end the ground GND due to the differential characteristic of the MOS differential circuit 3. This is so even when the output signal at the preceding stage has not reached its full amplitude.

Fourth Embodiment

Figure 6:
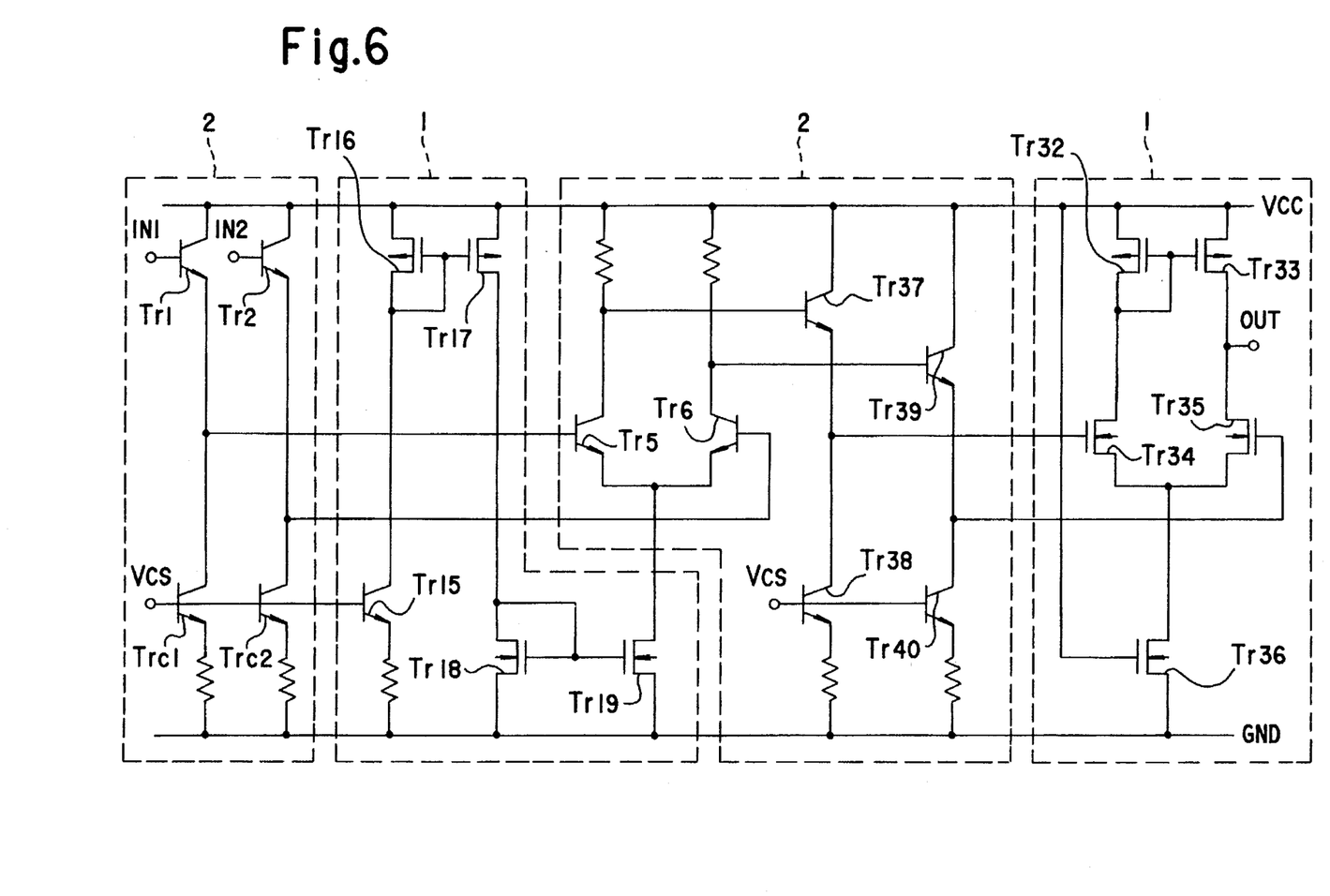
FIG. 6 is a circuit diagram showing a fourth embodiment of the present invention.

FIG. 6 shows a fourth embodiment of the present invention. This embodiment is similar to that of the third embodiment except that the current source circuit 1 in the third embodiment is replaced with the current source circuit 1 of the first embodiment. The converter, as per the first embodiment, can also produce an output signal OUT whose amplitude corresponds to the potential difference between the power supply $V_{CC}$ the ground GND. In addition, a power supply with a lower voltage can be selected as the power supply $V_{CC}$.

Fifth Embodiment

Figure 7:
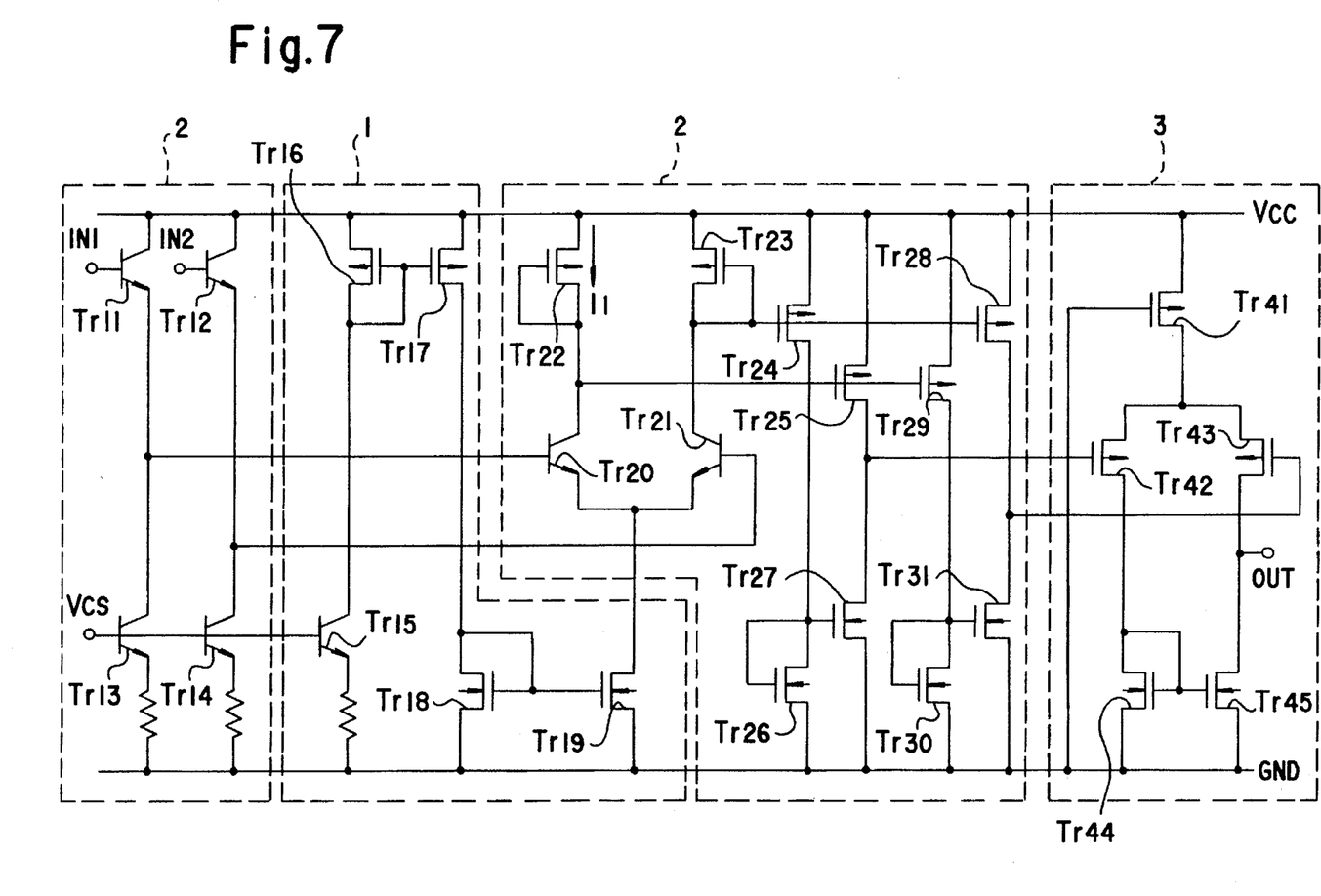
FIG. 7 is a circuit diagram showing a fifth embodiment of the present invention.

FIG. 7 shows a fifth embodiment of this invention, which is similar to that of the first embodiment except that the input transistors Tr34 and Tr35 in the MOS differential circuit 3 are replaced with P channel MOS transistors Tr42 and Tr43. This modification will be described more specifically. The drains of the transistors Tr25 and Tr27 are connected to the gate of the PMOS transistor Tr42. The drains of the transistors Tr28 and Tr31 are connected to the gate of the PMOS transistor Tr43. The sources of the transistors Tr42 and Tr43 are connected to the high potential power supply $V_{CC}$ via a P channel MOS transistor Tr41. The transistor Tr41 has its gate grounded in order to maintain the transistor on.

The MOS differential circuit 3 further includes two NMOS transistors Tr44 and Tr45. The transistor Tr44 has a source connected to the ground, a drain connected to the drain of the transistor Tr42 and a gate connected to its own drain. The transistor Tr45 has a source connected to the ground, a drain connected to the drain of the transistor Tr43 and a gate connected to the gate of the transistor Tr44. The NMOS transistors Tr44 and Tr45 consequently combine to form a current mirror circuit. The output signal OUT is output from the common drain of the transistors Tr43 and Tr45.

The level converter also has the same function and advantages as the first embodiment. That is, due to the characteristics of the MOS differential circuit 3, the amplitude of the output signal OUT corresponds to the potential difference between the power supply $V_{CC}$ and the ground GND, even when the output signal at the preceding stage has not yet reached its full output amplitude.

Although only several embodiments of the present invention have been described herein, it should be apparent to those skilled in the art that the present invention may be embodied in many other specific forms without departing from the spirit or scope of the invention.

Therefore, the present examples and embodiments are to be considered as illustrative and not restrictive and the invention is not to be limited to the details given herein, but may be modified within the scope of the appended claims.

What is claimed is:

1. A signal level converter supplied with power from a high and a low potential power supplies, for converting a signal having a first logic voltage swing characteristic of an ECL level signal used in an ECL circuit to a signal having a second logic voltage swing characteristic of a MOS level signal used in a MOS circuit, the converter comprising:

a level converting section for converting the supplied signal having a first logic voltage swing characteristic into an intermediate signal having a logic voltage swing characteristic different from the first voltage swing characteristic, said level converting section including a differential pair of bipolar junction transistors receiving said signal having a first logic voltage swing characteristic and wherein said intermediate signal is responsive to an output of said differential pair of bipolar junction transistors; and a differential circuit including a differential pair of MOS transistors coupled to said level converting section and responsive to said intermediate signal, for generating an output signal at a second voltage swing characteristic.

2. The signal level converter according to claim 1, wherein said differential pair of MOS transistors have substantially similar conductivity characteristics, gates supplied with said intermediate signal, sources interconnected to one of said high and low potential power supplies, and one drain serving as a terminal to output the signal generated by said differential circuit; and wherein said differential circuit includes a current mirror circuit coupled to said differential pair of MOS transistors, said current mirror circuit comprising a pair of transistors having conductivity characteristics different from the conductivity characteristics of said MOS transistors.

3. The signal level converter according to claim 2, wherein said MOS transistors of said differential circuit are N channel MOS transistors.

4. The signal level converter according to claim 2, wherein said MOS transistors of said differential circuit are P channel MOS transistors.

5. The signal level converter according to claim 1 further comprising a current source circuit for said level converting section, said current source circuit including a current mirror circuit formed by a pair of MOS transistors.

6. The signal level converter of claim 1, wherein said second swing characteristic of said output signal of said differential circuit varies substantially between high and low potentials of said high and low potential power supplies.

* * * * *